(12) United States Patent
Yim et al.

(10) Patent No.: US 8,187,921 B2
(45) Date of Patent: May 29, 2012

(54) SEMICONDUCTOR PACKAGE HAVING INK-JET TYPE DAM AND METHOD OF MANUFACTURING THE SAME

(75) Inventors: Choong-bin Yim, Cheonan-si (KR); Tae-je Cho, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/182,588

(22) Filed: Jul. 14, 2011

(65) Prior Publication Data
US 2011/0275177 A1  Nov. 10, 2011

Related U.S. Application Data

(63) Continuation of application No. 12/547,662, filed on Aug. 26, 2009, now Pat. No. 7,999,368.

(30) Foreign Application Priority Data

Sep. 29, 2008  (KR) .................. 10-2008-0095519

(51) Int. Cl.
*H01L 23/02* (2006.01)
(52) U.S. Cl. ........ 438/109; 438/106; 438/121; 257/686; 257/777; 257/E23.129; 257/E25.027; 257/678

(58) Field of Classification Search .................. 257/686; 438/109
See application file for complete search history.

(56) References Cited

U.S. PATENT DOCUMENTS

| | | | |
|---|---|---|---|
| 2002/0028533 A1* | 3/2002 | Tang et al. | 438/106 |
| 2003/0090006 A1* | 5/2003 | Farnworth | 257/787 |
| 2005/0017340 A1* | 1/2005 | Shibue | 257/686 |
| 2005/0184379 A1* | 8/2005 | Shiozawa et al. | 257/686 |
| 2006/0160917 A1* | 7/2006 | Oyanagi et al. | 522/7 |

* cited by examiner

*Primary Examiner* — Ajay K Arora
(74) *Attorney, Agent, or Firm* — F. Chau & Associates, LLC

(57) ABSTRACT

A semiconductor package includes a substrate which includes a chip mounting unit disposed on a first surface thereof and a pad forming unit disposed on an outer region of the chip mounting unit. The semiconductor package further includes a plurality of pads disposed on the pad forming unit of the substrate, a semiconductor chip disposed on the chip mounting unit of the substrate, a dam disposed on the first surface of the substrate between the semiconductor chip and the pad forming unit, and wherein the dam separates at least a portion of the pads from the semiconductor chip. In addition, the semiconductor package further includes an underfill material disposed between an active surface of the semiconductor chip and the first surface of the substrate and wherein an upper surface of the dam is rounded due to surface tension.

14 Claims, 14 Drawing Sheets

200 230 280a 280a 200 230 280b 200 230 280c 200 230 280d

SEMICONDUCTOR PACKAGE HAVING INK-JET TYPE DAM AND METHOD OF MANUFACTURING THE SAME

CROSS-REFERENCE TO RELATED APPLICATIONS

This application is a continuation of U.S. patent application Ser. No. 12/547,662 filed Aug. 26, 2009, now U.S. Pat. No. 7,999,368 which claims priority from Korean Patent Application No. 10-2008-0095519, filed on Sep. 29, 2008, the disclosures of which are each hereby incorporated by reference herein in their entireties.

BACKGROUND (i) Technical Field

The present disclosure relates to a semiconductor package and to a method of manufacturing the same, and more particularly, to a semiconductor package having a dam formed using an inkjet process to prevent an underfill material from bleeding and to a method of manufacturing the semiconductor package.

(ii) Description of the Related Art

As electronic devices become larger in capacity, more lightweight, and thinner, semiconductor packages are also required to be of higher density, miniaturized, and thinner. In flip chip packages that meet the above-mentioned requirements, a flip chip is typically mounted on a substrate and an underfill material is injected between the flip chip and the substrate to protect an active surface of the flip chip and bumps. However, a bleeding of the underfill material may be caused in a dispensing process for injecting the underfill material. The underfill material may in turn contaminate bonding pads for wire bonding on the substrate or ball pads of a top package in a package on package (POP), and thus, an assembling failure may be caused. Therefore, the bleeding of the underfill material may be an obstacle in reducing the size of a package.

A dam may be formed on a substrate to prevent an underfill material from bleeding. In the conventional art, the dam is formed on the substrate by printing a solder resist in the course of manufacturing the substrate, and afterwards, a semiconductor chip is mounted on the substrate having the dam and an underfill material is deposited between the semiconductor chip and the substrate. However, as the dam is formed in the course of manufacturing the substrate, the height of the dam for effectively control the bleeding of the underfill material may not be increased or various pattern shapes of dams may not be formed, and an additional method of forming the dam must also be performed. Also, there may be a limit in the coining height during coining of solder on pads (SOPs) due to the dam.

SUMMARY

Exemplary embodiments of the present invention may provide a semiconductor package having an inkjet type dam.

In accordance with an exemplary embodiment of the present invention, a semiconductor package is provided. The semiconductor package includes a substrate which includes a chip mounting unit disposed on a first surface thereof and a pad forming unit disposed on an outer region of the chip mounting unit. The semiconductor package further includes a plurality of pads disposed on the pad forming unit of the substrate, a semiconductor chip disposed on the chip mounting unit of the substrate, a dam disposed on the first surface of the substrate between the semiconductor chip and the pad forming unit, and wherein the dam separates at least a portion of the pads from the semiconductor chip. In addition, the semiconductor package further includes an underfill material disposed between an active surface of the semiconductor chip and the first surface of the substrate and wherein an upper surface of the dam is rounded due to surface tension.

The dam may be arranged to surround the semiconductor chip as multi-walls. The dam may be arranged to surround the semiconductor chip and have a wounded shape. The dam may comprise at least one bar pattern arranged corresponding to a side of the semiconductor chip or a corrugate shape pattern arranged corresponding to at least a portion of the pads. The dam may comprise ring shape patterns that surround at least portions of the pads, respectively.

The dam may have a width of 50 to 100 μm and a height of greater than 15 μm. The distance between the semiconductor chip and the dam may be 20 to 50 μm, the distance between the dam and the pads may be 10 to 50 μm, and the distance between the semiconductor chip and the pads may be maintained at a minimum of 80 μm.

The dam may include an inkjet type pattern. Letters may be marked on a top surface of the semiconductor chip. The dam may be formed of the same material as the letters.

In accordance with an exemplary embodiment of the present invention, a method for manufacturing a semiconductor package is provided. The method includes forming a substrate which includes a chip mounting unit on a first surface thereof and a pad forming unit disposed on an outer region of the chip mounting unit and a plurality of pads disposed on the pad forming unit of the substrate, mounting a semiconductor chip on the chip mounting unit of the substrate, forming a dam having a rounded upper surface on the first surface of the substrate between the semiconductor chip and the pad forming unit of the substrate and marking letters on the semiconductor chip. The method further includes deporting an underfill material between an active surface of the semiconductor chip and the first surface of the substrate, wherein the dam prevents the underfill material from bleeding towards the pads.

In accordance with another exemplary embodiment of the present invention, a semiconductor package is provided. The semiconductor package includes a first package which includes a first substrate and a first semiconductor chip mounted on the first substrate. The first substrate includes a plurality of first landing pads and a plurality of second landing pads which are disposed on a first surface of the first substrate, and a plurality of third landing pads disposed on a second surface opposite to the first surface of the first substrate. An active surface of the first semiconductor chip is bonded to the first substrate and faces the first surface of the first substrate so that a plurality of first solder balls electrically connect the first landing pads of the first substrate and first chip pads disposed in the active surface of the first semiconductor chip. In addition, the semiconductor package further includes a second package which includes a second substrate and a second semiconductor chip. The second substrate includes a plurality of bonding pads disposed in a first surface thereof and a plurality of fourth landing pads disposed in a second surface opposite to the first surface of the second substrate. The second semiconductor chip is mounted onto the second substrate by an adhesive and second chip pads of the second semiconductor chip are electrically connected, respectively to the bonding pads of the second substrate through wires. A plurality of second solder balls disposed respectively on the plurality of the fourth landing pads are electrically connected to the plurality of the second landing pads of the first substrate, respectively such that the first package and the second package are electrically connected to each other. Moreover, the semiconductor package further includes a sealing unit formed on the second package which seals the second semiconductor chip, the wires, the bonding pads and the second chip pads, an underfill material disposed between the first surface of the first substrate and the active surface of the first semiconductor chip and a dam for preventing the bleeding of the underfill material disposed between the underfill material and a pad forming unit disposed in the first surface of the first substrate, wherein the dam surrounds the first semiconductor chip, wherein an upper surface of the dam is rounded and wherein the dam has a width of 50 to 100 μm and a height of greater than 15 μm.

BRIEF DESCRIPTION OF THE DRAWINGS

Exemplary embodiments of the present invention can be understood in more detail from the following description, taken in conjunction with the accompanying drawings in which:

FIGS. 9A through 12A are plan views for illustrating the method of manufacturing the semiconductor package of FIG. 8, according to an exemplary embodiment of the present invention; and FIGS. 9B through 12B are cross-sectional views for illustrating a method of manufacturing the semiconductor package of FIG. 8, according to an exemplary embodiment of the present invention.

DETAILED DESCRIPTION OF THE EXEMPLARY EMBODIMENTS

Figure 1A:
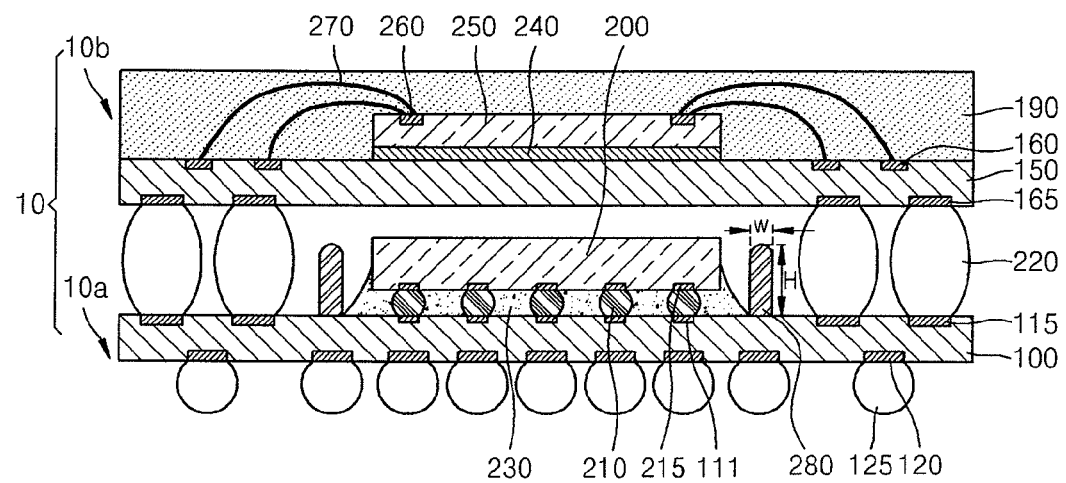
FIG. 1A is a cross-sectional view of a semiconductor package according to an exemplary embodiment of the present invention.

Exemplary embodiments of present invention will now be described more fully with reference to the accompanying drawings, in which exemplary embodiments of the invention are shown. The invention may, however, be embodied in many different forms and should not be construed as being limited to the exemplary embodiments set forth herein. In the drawings, the thicknesses of layers and regions are exaggerated for clarity. Like reference numerals in the drawings denote like elements.

Figure 1B:
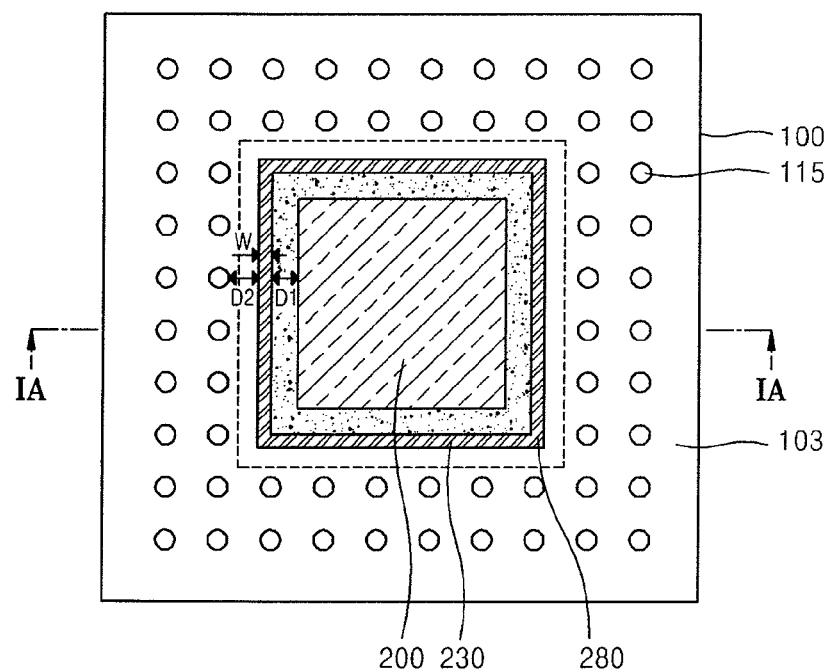
FIG. 1B is a plan view of a first package of the semiconductor package of FIG. 1A, according to an exemplary embodiment of the present invention.
Figure 2A:
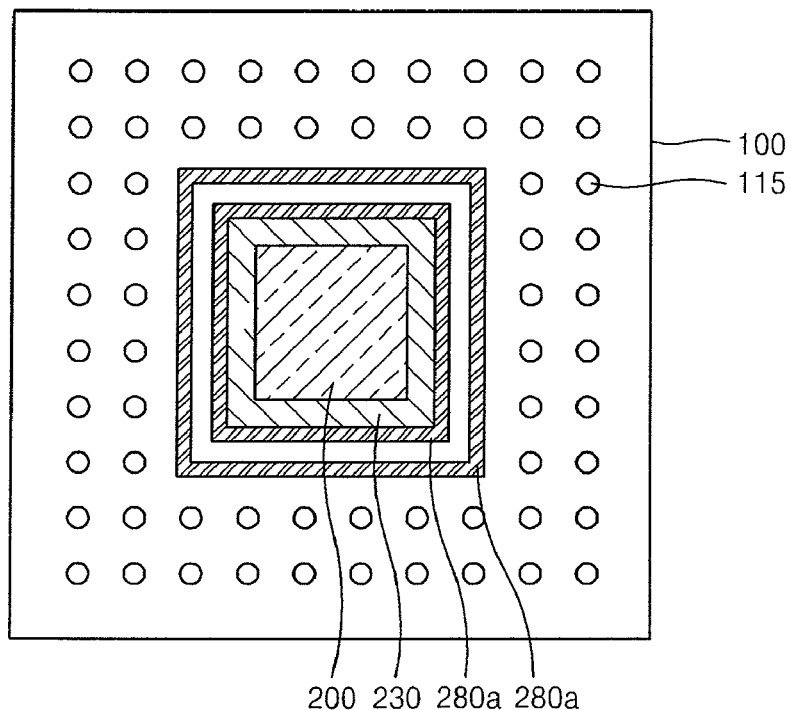
FIGS. 2A through 2H are plan views of structures of a dam of the semiconductor package of FIGS. 1A and 1B, according to an exemplary embodiment of the present invention.
Figure 2B:
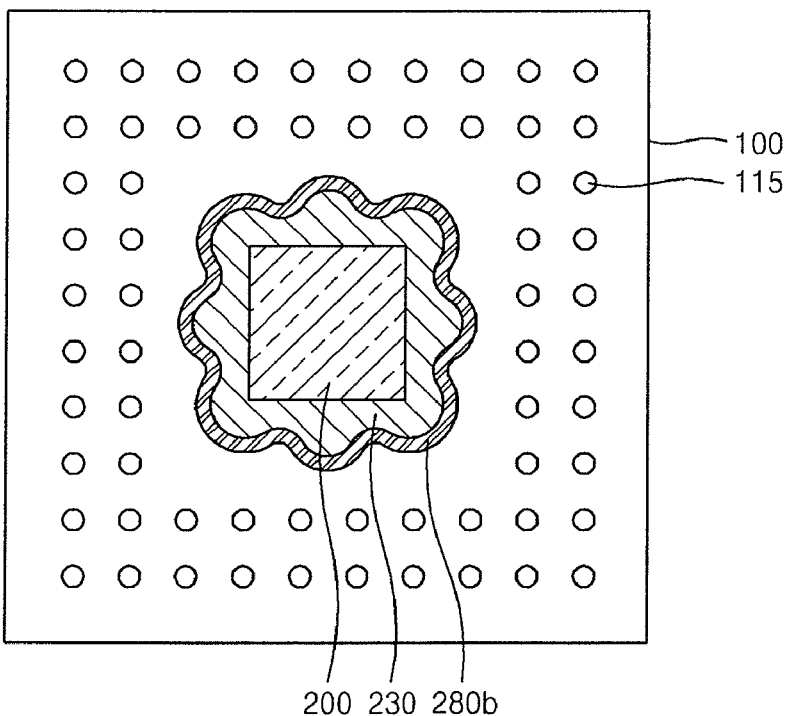
Figure 2C:
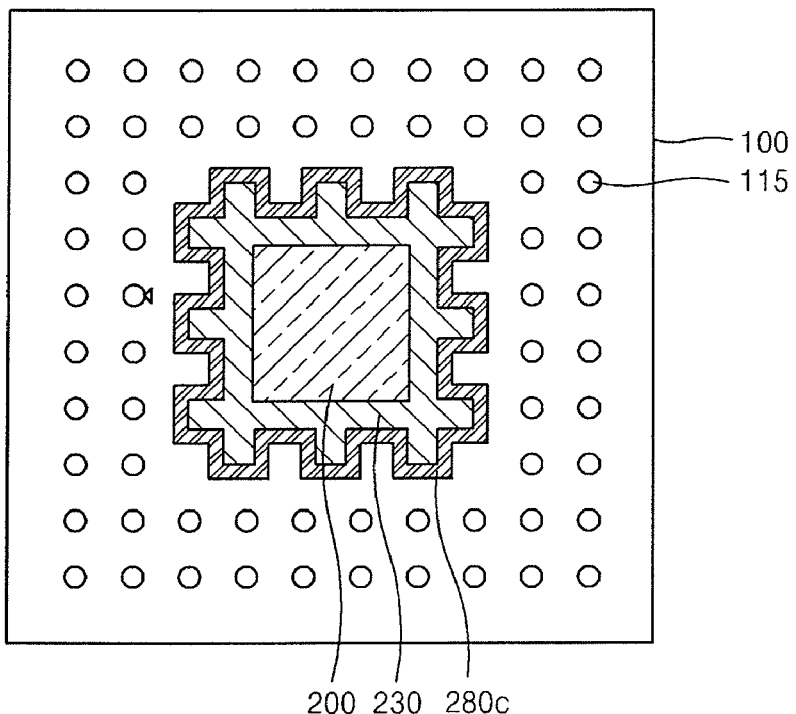
Figure 2D:
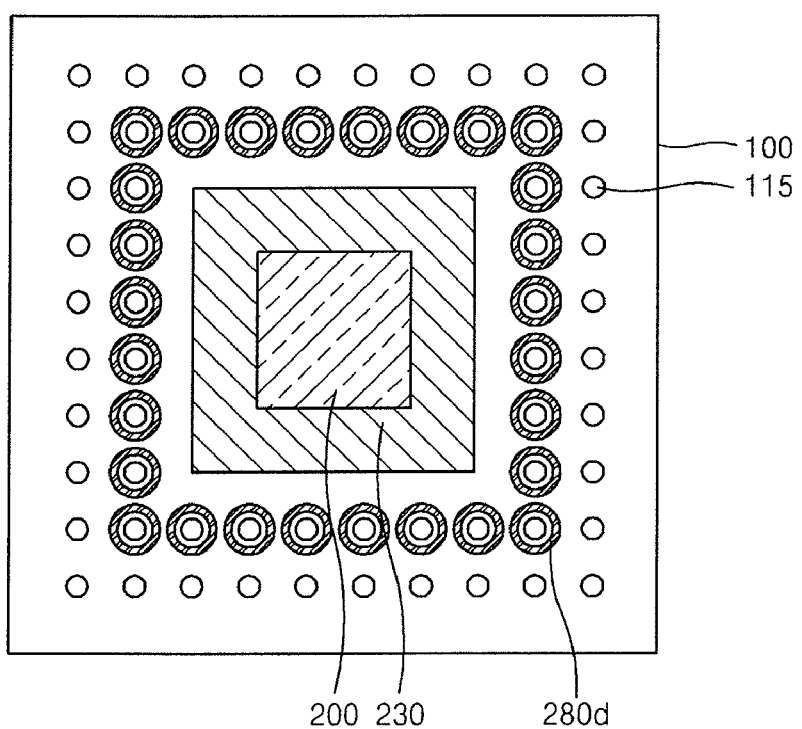
Figure 2E:
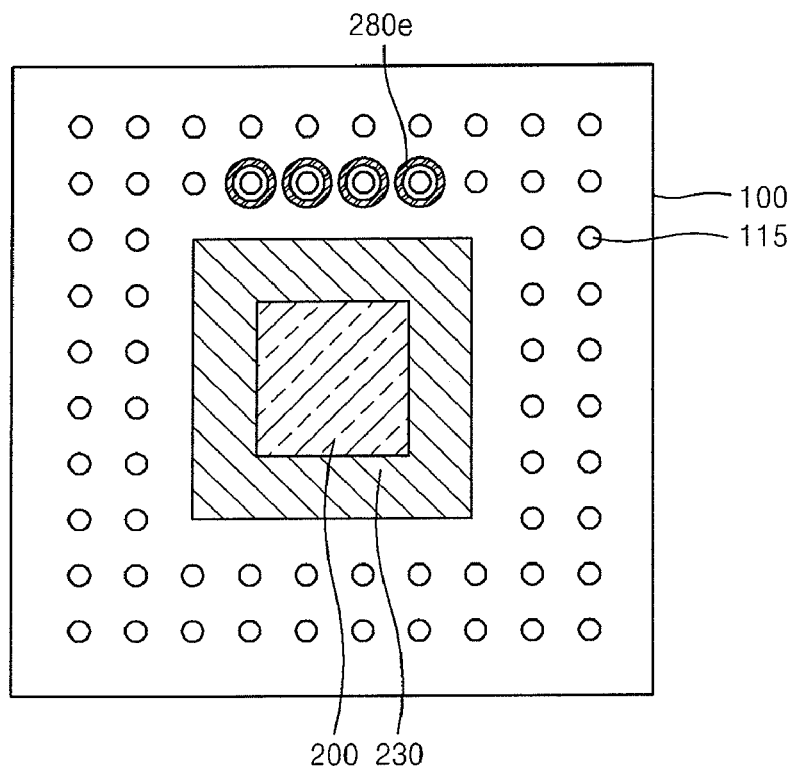
Figure 2F:
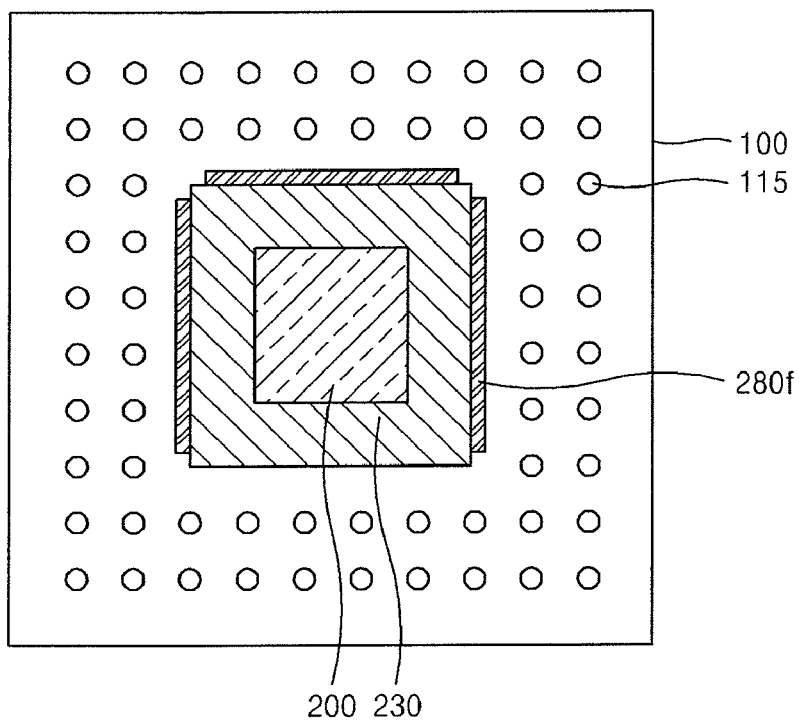
Figure 2G:
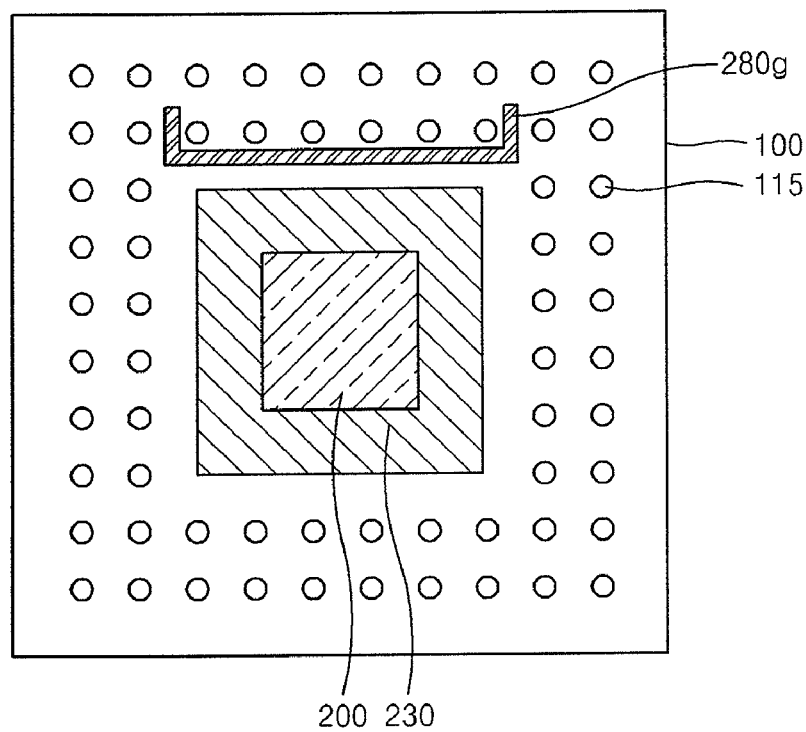
Figure 2H:
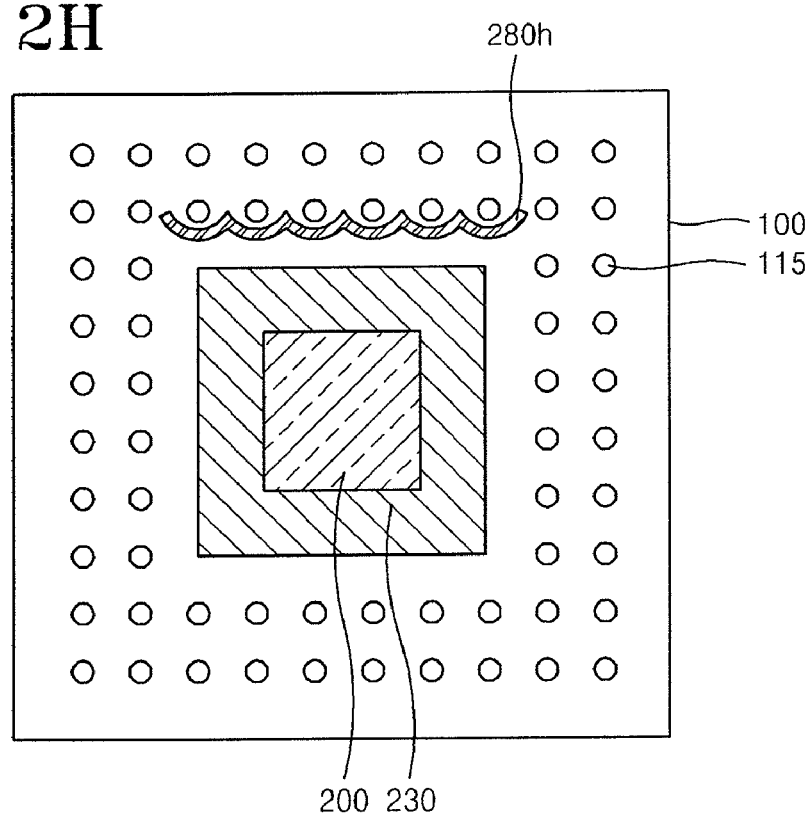

FIG. 1A is a cross-sectional view of a semiconductor package 10 according to an exemplary embodiment of the present invention. FIG. 1B is a plan view of a first package 10a of the semiconductor package 10 of FIG. 1A, and FIG. 1A is a cross-sectional view taken along line IA-IA of FIG. 1B. Referring to FIGS. 1A and 1B, the semiconductor package 10 may include a first package 10a and a second package 10b. The first package 10a may include a first substrate 100 and a first semiconductor chip 200 mounted on the first substrate 100. The first substrate 100 may include a plurality of first landing pads 111 and second landing pads 115, which are arranged on a first surface of the first substrate 100, and a plurality of third landing pads 120 arranged on a second surface opposite to the first surface of the first substrate 100.

An active surface of the first semiconductor chip 200 may be flip chip bonded onto the first substrate 100 to face the first surface of the first substrate 100 so that solder balls 210 electrically connect the first landing pads 111 of the first substrate 100 and first chip pads 215 arranged in the active surface of the first semiconductor chip 200. Solder balls 125 for connecting the semiconductor package 10 to external devices may be arranged on the third landing pads 120, respectively.

The second package 10b may include a second substrate 150 and a second semiconductor chip 250. The second substrate 150 may include bonding pads 160 arranged in a first surface thereof and fourth landing pads 165 arranged in a second surface opposite to the first surface of the second substrate 150. The second semiconductor chip 250 may be mounted onto the second substrate 150 using an adhesive 240, and second chip pads 260 of the second semiconductor chip 250 may be electrically connected, respectively, to the bonding pads 160 of the second substrate 150 through wires 270. Solder balls 220 arranged respectively on the fourth landing pads 165 may be electrically connected to the second landing pads 115 of the first substrate 100, respectively so that the first package 10a and the second package 10b are electrically connected to each other. The second semiconductor chip 250, the wires 270, the bonding pads 160, and the second chip pads 260 may be sealed with a sealing unit 190.

An underfill material 230 may be filled between the first surface of the first substrate 100 and the active surface of the first semiconductor chip 200 to protect the solder balls 210. A dam 280 for preventing the bleeding of the underfill material 230 may be formed between the underfill material 230 and a pad forming unit 103. The dam 280 may be arranged to surround the first semiconductor chip 200.

The dam 280 may be formed using, for example, an inkjet process, and thus, an upper part of the dam 280 may be rounded. For example, the dam 280 may include an ink composite that contains a (meta) acryl group monomer, a (meta) acryl group oligomer, a photo-initiator, a dye, and an additive.

The (meta) acryl group monomer may be, for example, at least one selected from the group consisting of a mono functional (meta) acryl group monomer and a multi functional (meta) acryl group monomer.

The mono functional (meta) acryl group monomer may reduce the viscosity of the ink composite or may increase the hardness of a film formed of the ink composite. The multi functional (meta) acryl group monomer may increase the viscosity of the ink composite or may improve the physical properties of a film formed of the ink composite, such as, for example, the hardness of a film formed of the ink composite.

The mono functional (meta) acryl group monomer may be, for example, lauryl acrylate and metacrylate vinyl ether, and the multi functional (meta) acryl group monomer may be, for example, cyclohexane dimethanol diacrylate, tris(2-hydroxyethyl)isocyanate triacrylate, and ethoxylated trimethylolpropane triacrylate.

The photo-initiator may initiate an ultraviolet (UV) hardening reaction of components that constitute the ink composite, and may be, for example, an aromatic ketone amine group compound, for example, trimethyl benzophenon, amine functional acrylate, 2-methyl-1[4-(methylthio)]phenyl-2-monopolynopropane-1-on, and isopropylthioxanton.

The (meta) acryl group oligomer may be included in the ink composite to control viscosity.

The dye may added to the ink composite to realize color, and may be, for example, a titanium oxide. The titanium oxide can be obtained commercially as Rutile.

The additive may be a material that functions to stabilize the ink composite and repress the hardening of the ink composite, and may be, for example, a surfactant. Examples of the additive may include but are not limited to monomethyl ethyl hydroquinone (MEHQ) and tert-butyl hydroquinone (TBHQ).

In the ink composite according to the current exemplary embodiment, the content of each of the components may be a conventional level.

The dam 280 may have a width W of 50 to 100 mu.m and a height H of 15 to 20 μm, taking into consideration the adhesiveness with the first substrate 100. The distance D1 between the dam 280 and the first semiconductor chip 200 should be maintained greater than 20 μm. At this point, the distance D1 should be maintained at 20 to 50 μm as a scattering distance of the ink and a mounting margin of the first semiconductor chip 200 should be considered in forming the dam 280. Also, the distance D2 between the dam 280 and the second landing pads 115 may be maintained below 50 μm. At this point, as the scattering distance of the ink should be considered in forming the dam 280, the distance D2 may be determined according to the material used to form the dam 280, and may be maintained at 10 to 50 μm.

In the case of forming the dam 280 using a conventional solder resist, the width of a dam is 130 to 200 μm, the distance between the dam and a semiconductor chip is maintained at 100 to 200 μm, and the distance between the dam and landing pads is maintained at 50 to 150 μm. Therefore, the minimum distance between the semiconductor chip and the landing pads should be maintained at least at 280 μm. However, in the current exemplary embodiment, as the dam 280 is formed using an inkjet process, the distance between the first semiconductor chip 200 and the second landing pads 115 can be maintained at a minimum distance, that is, 80 μm. Thus, the size of the first semiconductor chip 200 can be reduced. As the distance between the first semiconductor chip 200 and the second landing pads 115 is reduced, the area of the pad forming unit 103 may be increased, and thus, the number of second landing pads 115 can be increased. Also, in the conventional art, the height of a dam is lower than 15 μm. However, in the current exemplary embodiment, the height of the dam can be maintained at 15 to 20 μm. Accordingly, this is beneficial for blocking the bleeding of the underfill material 230.

As depicted in FIGS. 2A through 2H, the dam 280 may have various pattern shapes. The dam 280 may include multiple dam patterns 280a in FIG. 2A or may include wound dam patterns 280b and 280c that surround the first semiconductor chip 200 in FIGS. 2B and 2C. Furthermore, the dam 280 may include, for example, ring shape dam patterns 280d that surround the second landing pads 115 arranged adjacent to the first semiconductor chip 200.

Also, the dam 280 may include at least one dam pattern arranged on at least a side of the first semiconductor chip 200, and not arranged to completely surround the first semiconductor chip 200. The dam 280 may include, for example, ring shape dam patterns 280e surrounding portions of the second landing pads 115 that are arranged corresponding to an upper side of the first semiconductor chip 200 in FIG. 2G or may include, for example, bar shape dam patterns 280f that are arranged corresponding to three sides of the first semiconductor chip 200 in FIG. 2F.

Also, the dam 280 may include dam patterns 280g and 280h that are arranged to protect portions of the second landing pads 115 that surround the first semiconductor chip 200, by grouping the portions of the second landing pads 115. At this point, the dam patterns 280g and 280h may be arranged on a portion of the outer portion of the first semiconductor chip 200 that can be readily damaged by the underfill material 230, for example, the portion where the underfill material 230 is injected or where the underfill material 230 may be readily bleeded.

Figure 3:
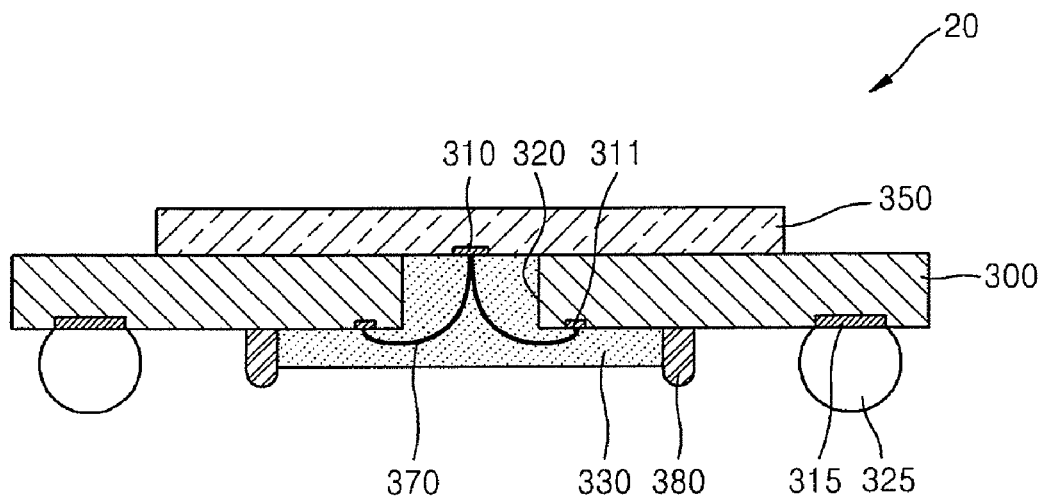
FIG. 3 is a cross-sectional view of a semiconductor package according to an exemplary embodiment of the present invention.

FIG. 3 is a cross-sectional view of a semiconductor package 20 according to another exemplary embodiment of the present invention. Referring to FIG. 3, the semiconductor package 20 may include a packaging substrate 300 and a semiconductor chip 350 mounted on a chip mounting unit in a second surface of the packaging substrate 300. Chip pads 310, arranged in an active surface of the semiconductor chip 350, may be exposed through a window 320 and may be connected to bonding pads 311 arranged in a first surface of the packaging substrate 300 with wires 370. Landing pads 315, arranged in the first surface of the packaging substrate 300, may be electrically connected to solder balls 325, respectively, for external connection.

A dam 380 may be arranged on the first surface of the packaging substrate 300 between the landing pads 315 and the bonding pads 311. The dam 380 may be formed using, for example, an inkjet process, and may each have a predetermined height H and a predetermined width W. The dam 380 may be arranged apart from the bonding pads 311 with the first distance D1 as shown in FIG. 1B, and are arranged apart from the landing pads 315 with the second distance D2 as shown in FIG. 1B. The dam 380 may include the dam patterns as described with reference to FIGS. 2A through 2C. An underfill material 330 may be deposited on the active surface of the semiconductor chip 350 exposed by the window 320, and on a portion of the first surface of the packaging substrate 300 within the dam 380.

Figure 4:
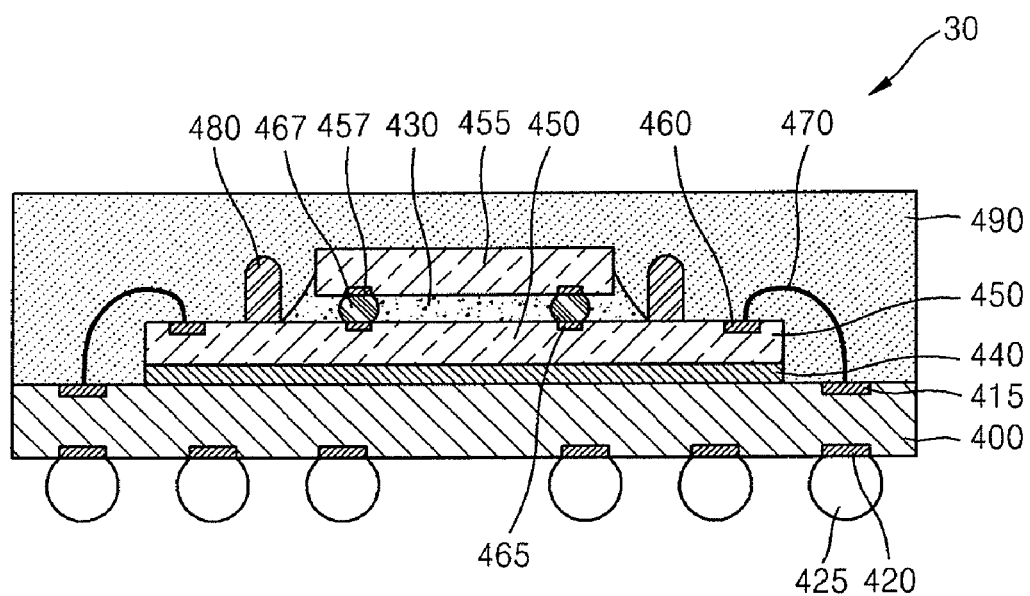
FIG. 4 is a cross-sectional view of a semiconductor package according to an exemplary embodiment of the present invention.

FIG. 4 is a cross-sectional view of a semiconductor package 30 according to another exemplary embodiment of the present invention. Referring to FIG. 4, the semiconductor package 30 may include a substrate 400 and first and second semiconductor chips 450 and 455 stacked on a first surface of the substrate 400. The first semiconductor chip 450 may be mounted on the first surface of the substrate 400 using an adhesive 440. Chip pads 460 arranged in an active surface of the first semiconductor chip 450 may be electrically connected to bonding pads 415 arranged in the first surface of the substrate 400 with wires 470. Solder balls 425 may be arranged respectively on landing pads 420 arranged on a second surface of the substrate 400.

The active surface of the first semiconductor chip 450 and an active surface of the second semiconductor chip 455 may be arranged to face each other so that first landing pads 465 of the first semiconductor chip 450 may be electrically connected to second landing pads 457 of the second semiconductor chip 455 through solder balls 467. An underfill material 430 may be deposited between the first semiconductor chip 450 and the second semiconductor chip 455 to protect the solder balls 467.

A dam 480 may be arranged on the active surface of the first semiconductor chip 450 between the second semiconductor chip 455 and the chip pads 460. The dam 480 may be formed using, for example, an inkjet process, and may each have a predetermined height H and a predetermined width W. The dam 480 may be arranged apart from the second semiconductor chip 455 with the first distance D1 as shown in FIG. 1B and may be arranged apart from the chip pads 460 with the second distance D2 as shown in FIG. 1B. The dam 480 may include dam patterns as described with reference to FIGS. 2A through 2C. A sealing resin 490 may be arranged on the substrate 400 to protect the first semiconductor chip 450, the second semiconductor chip 455, the wires 470, and the bonding pads 415, the chip pads 460 and the dam 480.

Figure 5A:
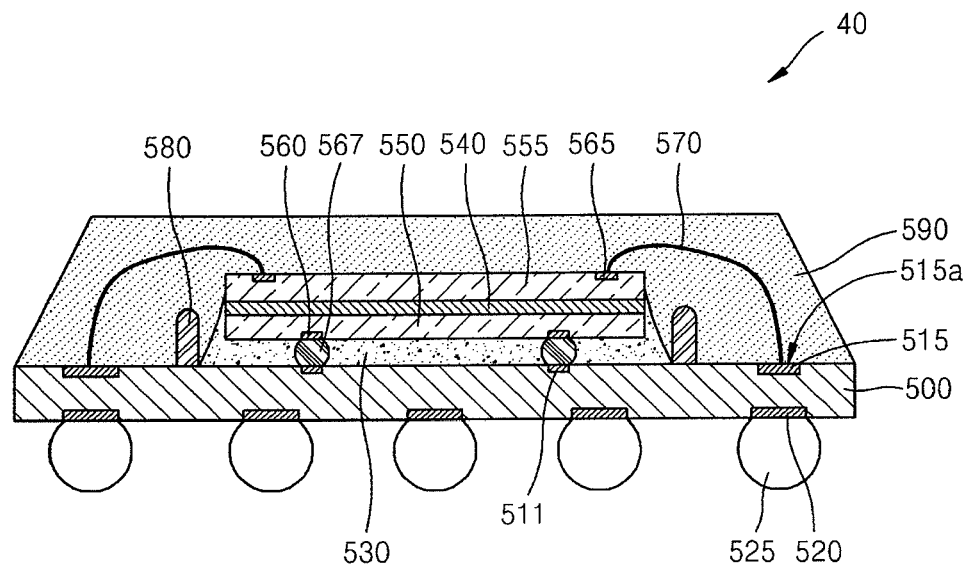
FIG. 5A is a cross-sectional view of a semiconductor package according to an exemplary embodiment of the present invention.
Figure 5B:
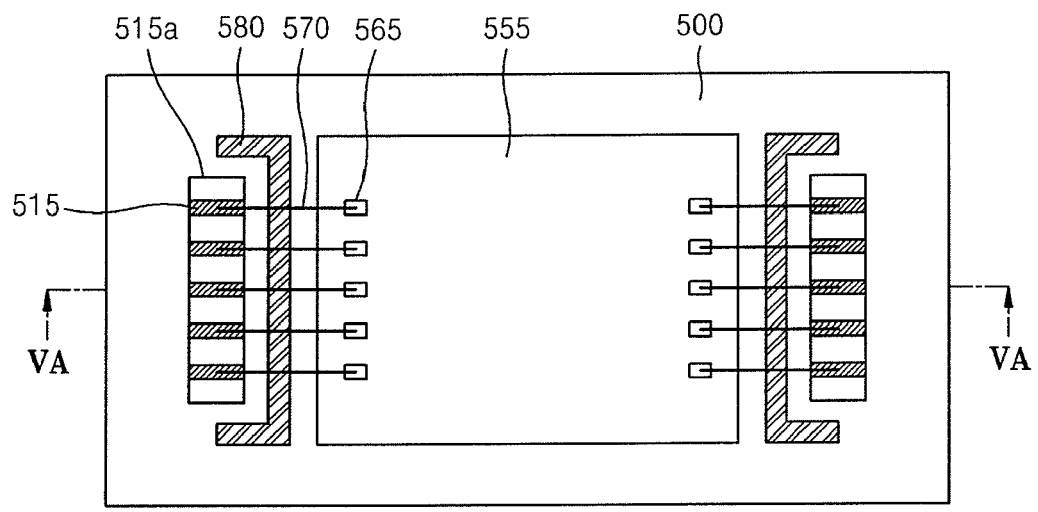
FIG. 5B is a plan view of the semiconductor package of FIG. 5A, according to an exemplary embodiment of the present invention.

FIGS. 5A and 5B are respectively a cross-sectional view and a plan view of a semiconductor package 40 according to another exemplary embodiment of the present invention. FIG. 5A is a cross-sectional view taken along line VA-VA of FIG. 5B. Referring to FIGS. 5A and 5B, a first semiconductor chip 550 and a second semiconductor chip 555 may be sequentially stacked on a chip mounting unit of a substrate 500. The surfaces opposite to active surfaces of the first semiconductor chip 550 and the second semiconductor chip 555 may be bonded to each other using an adhesive 540.

First landing pads 560 arranged in the active surface of the first semiconductor chip 550 may be electrically connected to landing pads 511 arranged in a first surface of the substrate 500 through solder balls 567. Bonding pads 565 arranged in the active surface of the second semiconductor chip 555 may be electrically connected to bonding pads 515 arranged in the first surface of the substrate 500 through wires 570. Solder balls 525 may be arranged respectively on landing pads 520 arranged in a second surface of the substrate 500.

An underfill material 530 may deposited between the first semiconductor chip 550 and the first surface of the substrate 500. The bonding pads 515 may be exposed through windows 515*a*, and a dam 580 may be partly formed between the first semiconductor chip 550 and the windows 515*a*. The dam 580 may be arranged to partially surround a portion of the windows 515*a*. The dam 580 may be formed using, for example, an inkjet process, and may each have a predetermined height H and a predetermined width W. The dam 580 may be arranged apart from the first semiconductor chip 550 with the first distance D1 as shown in FIG. 1B, and are arranged apart from the windows 151*a* with the second distance D2 as shown in FIG. 1B. The dams 580 may include dam patterns as shown in FIGS. 2A through 2C and FIGS. 2F through 2H.

Figure 6A:
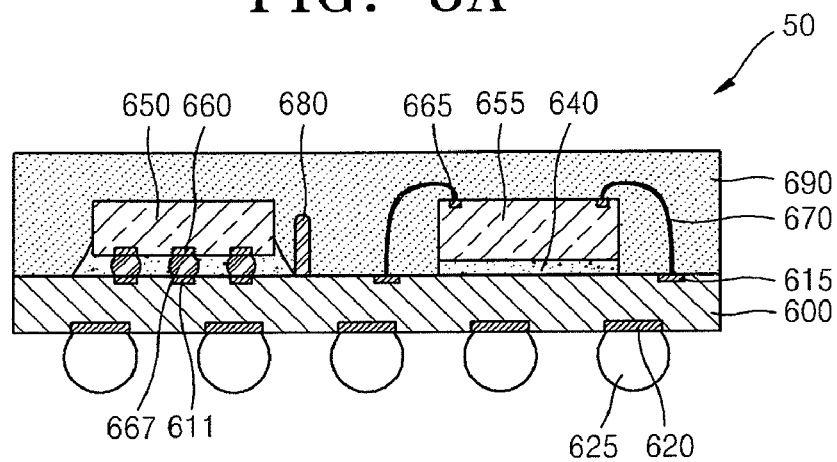
FIG. 6A is a cross-sectional view of a semiconductor package according to an exemplary embodiment of the present invention.
Figure 6B:
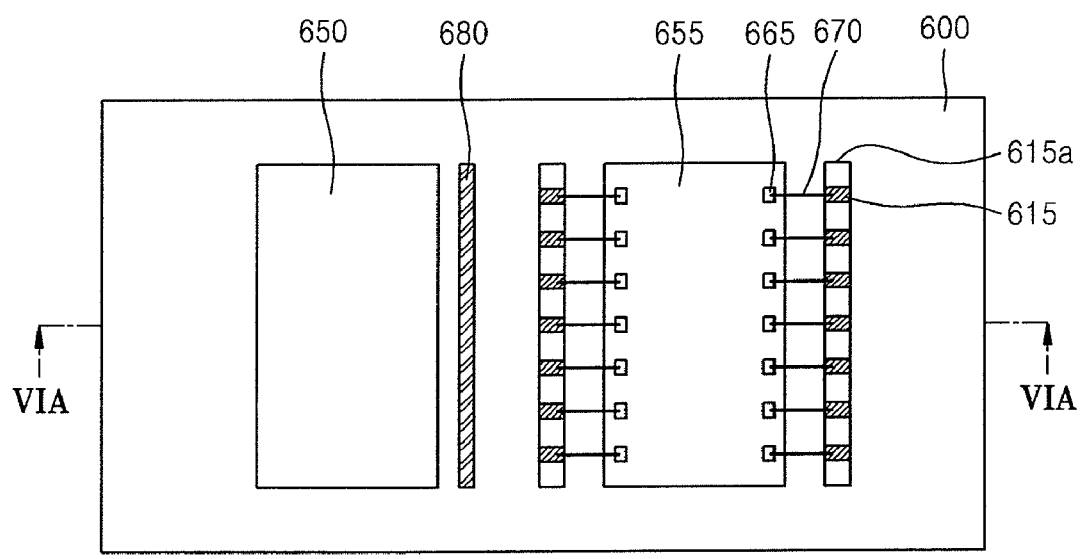
FIG. 6B is a plan view of the semiconductor package of FIG. 6A, according to an exemplary embodiment of the present invention.

FIGS. 6A and 6B are respectively a cross-sectional view and a plan view of a semiconductor package 50 according to another exemplary embodiment of the present invention. FIG. 6A is a cross-sectional view taken along line VIA-VIA of FIG. 6B. Referring to FIGS. 6A and 6B, the semiconductor package 50 may include a first semiconductor chip 650 and a second semiconductor chip 655, which are arranged on chip mounting units of a first surface of a substrate 600. The semiconductor package 50 of FIGS. 6A and 6B is similar to the semiconductor package 40 of FIGS. 5A and 5B, except that the first and second semiconductor chips 650 and 655 are arranged on the same surface.

Figure 7A:
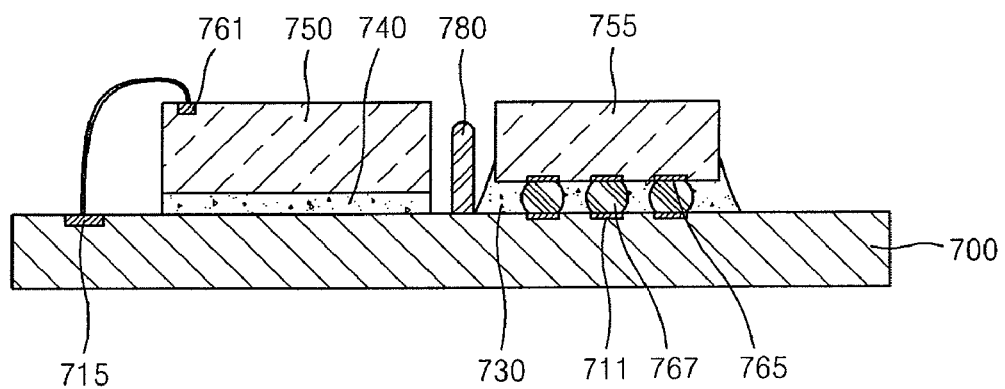
FIG. 7A is a cross-sectional view of a semiconductor package according to an exemplary embodiment of the present invention.
Figure 7B:
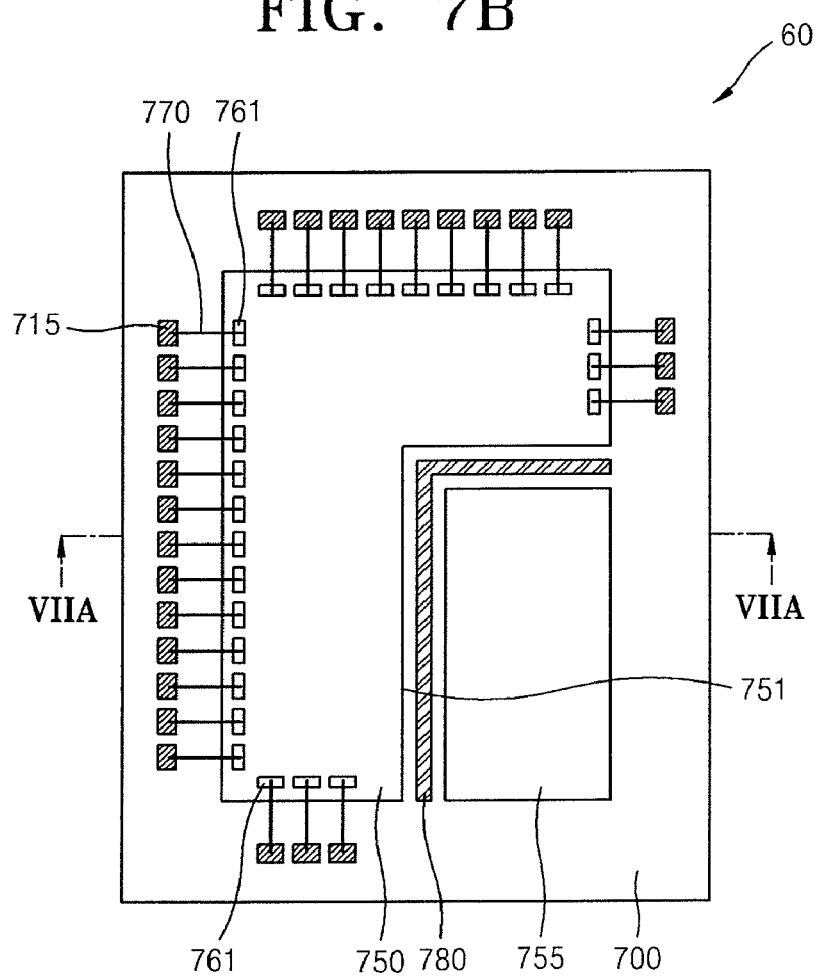
FIG. 7B is a plan view of the semiconductor package of FIG. 7A, according to an exemplary embodiment of the present invention.

FIGS. 7A and 7B are respectively a cross-sectional view and a plan view of a semiconductor package 60 according to another exemplary embodiment of the present invention. FIG. 7A is a cross-sectional view taken along line VII-VII of FIG. 7B. Referring to FIGS. 7A and 7B, the semiconductor package 60 may include a substrate 700 and a first semiconductor chip 750 and a second semiconductor chip 755, which are arranged on chip mounting units of a first surface of a substrate 700. The first semiconductor chip 750 may include an indent chip and the second semiconductor chip 755 may include a normal chip.

First chip pads 761 of the first semiconductor chip 750 may be electrically connected to bonding pads 715 of the substrate 700 through wires 770, and second chip pads 765 of the second semiconductor chip 755 may be electrically connected to landing pads 711 of the substrate 700 through solder balls 767. An underfill material 730 may filled between the second semiconductor chip 755 and the first surface of the substrate 700, and a dam 780 may be partly arranged between an indent portion 751 of the first semiconductor chip 750 and the second semiconductor chip 755. On the other hand, the dam 780 may be arranged to surround the second semiconductor chip 755.

Figure 8:
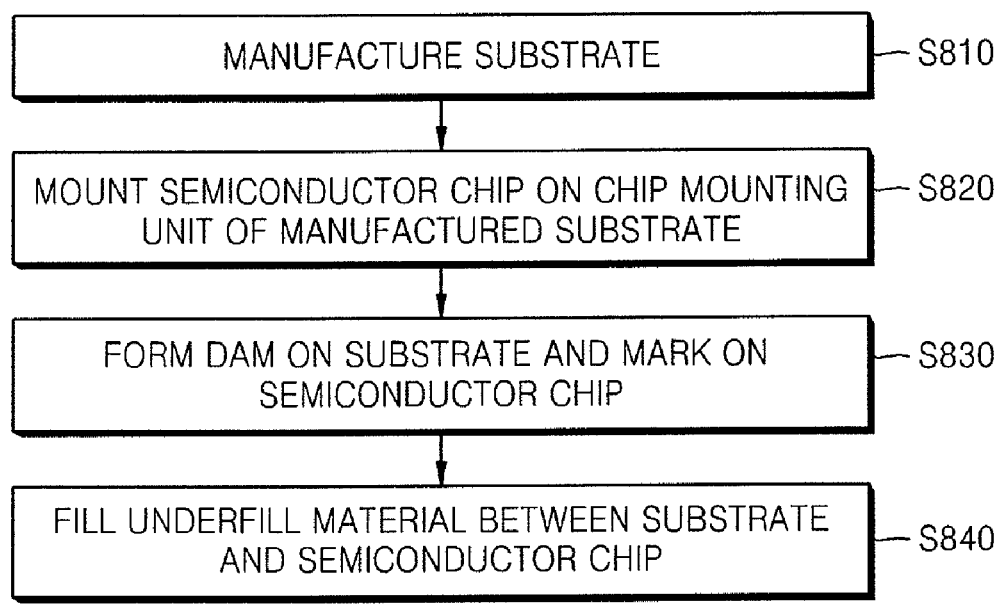
FIG. 8 is a flowchart of a method of manufacturing a semiconductor package according to an exemplary embodiment of the present invention.

FIG. 8 is a flowchart of a method of manufacturing a semiconductor package, according to an exemplary embodiment of the present invention. FIGS. 9A through 12A are plan views for illustrating the method of manufacturing the semiconductor package of FIG. 8, and FIGS. 9B through 12B are cross-sectional views taken along line B-B of FIGS. 9A through 12B, for illustrating the method of manufacturing the semiconductor package of FIG. 8. The methods described in FIGS. 8, 9A through 12A, and 9B through 12B are limited to the method of manufacturing the first package 10*a* of FIG. 1A.

Figure 9A:
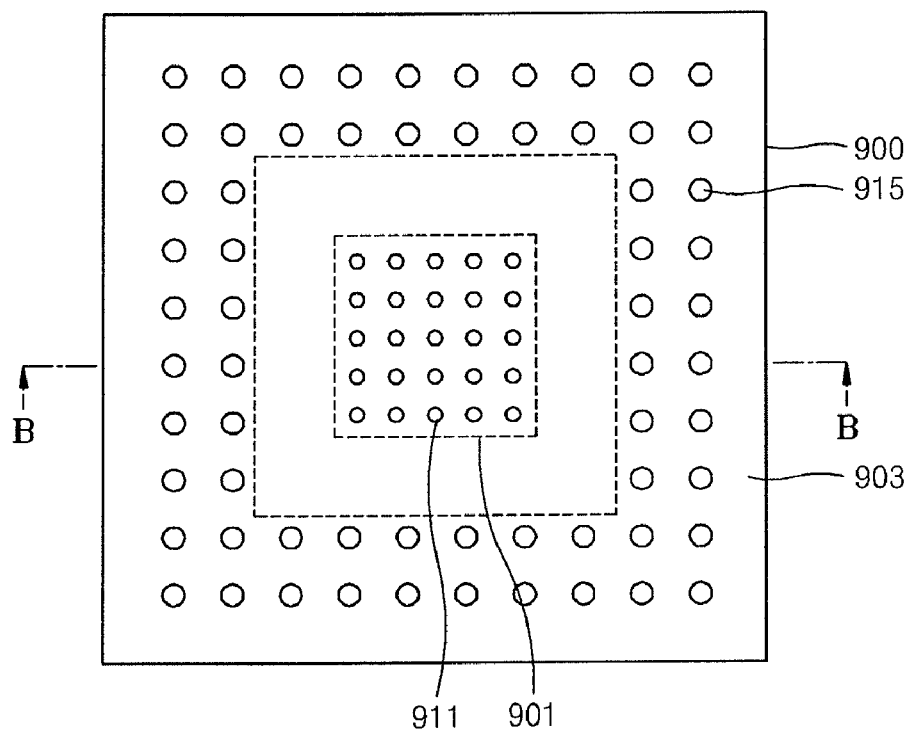
Figure 9B:
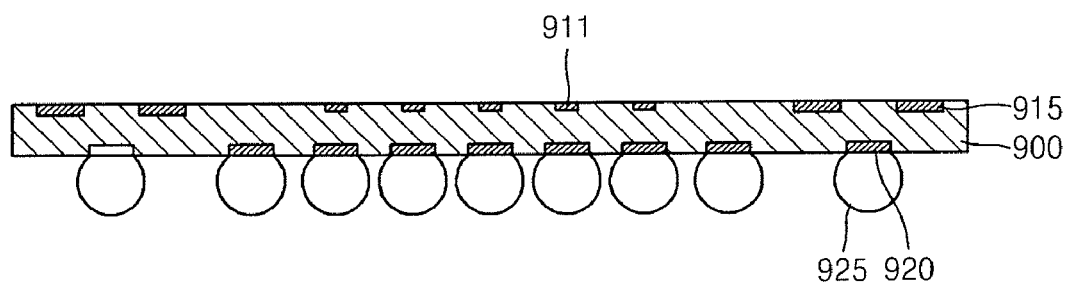

Referring to FIGS. 8, 9A, and 9B, a substrate 900 may be fabricated (S810). The substrate 900 may include, for example, a printed circuit board (PCB) or a tape wire substrate. The substrate 900 may include a chip mounting unit 901 on which a semiconductor chip (950 in FIGS. 10A and 10B) is arranged and a pad forming unit 903 arranged on an outer region of the chip mounting unit 901. The substrate 900 may include pads 911 for electrically connecting to the semiconductor chip 950. A plurality of pads 915 may be formed in the pad forming unit 903 of the substrate 900. The pads 915 may include, for example, bonding pads for bonding with wires or landing pads for attaching to solder balls.

Figure 10A:
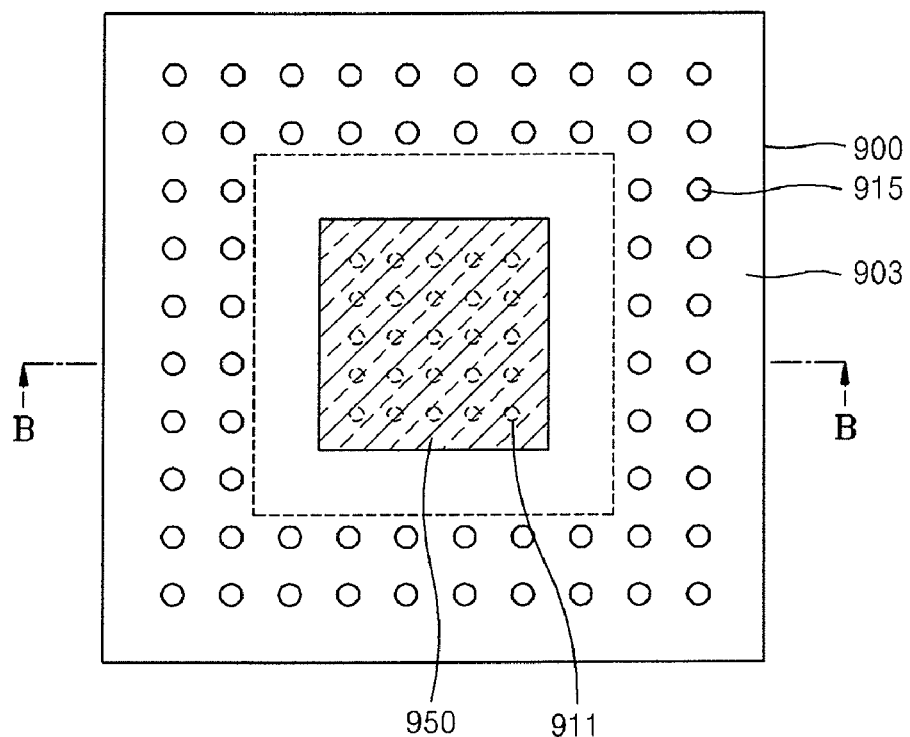
Figure 10B:
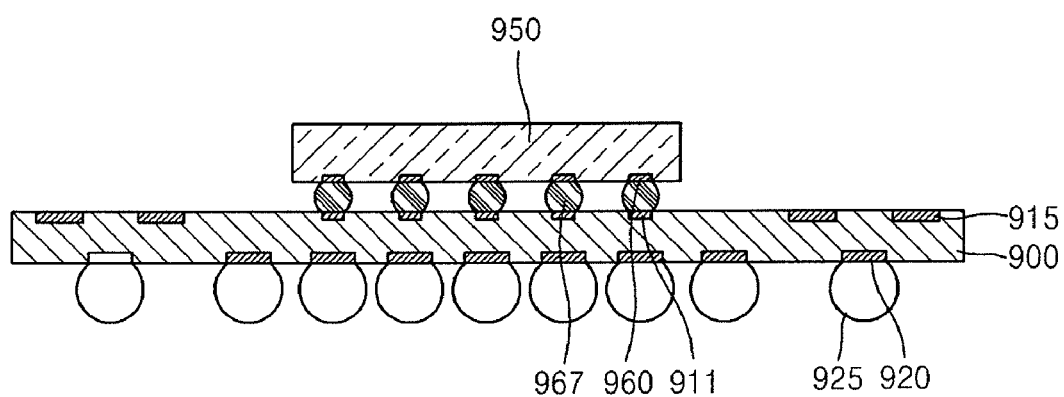

Referring to FIGS. 8, 10A, and 10B, the semiconductor chip 950 may be mounted on the chip mounting unit 901 of the substrate 900 (S820). The semiconductor chip 950 may be flip chip bonded onto the substrate 900. The chip pads 960 and the pads 911 may be electrically connected through the solder balls 967 which are attached in advance to the chip pads 960 of the semiconductor chips 950.

Figure 11A:
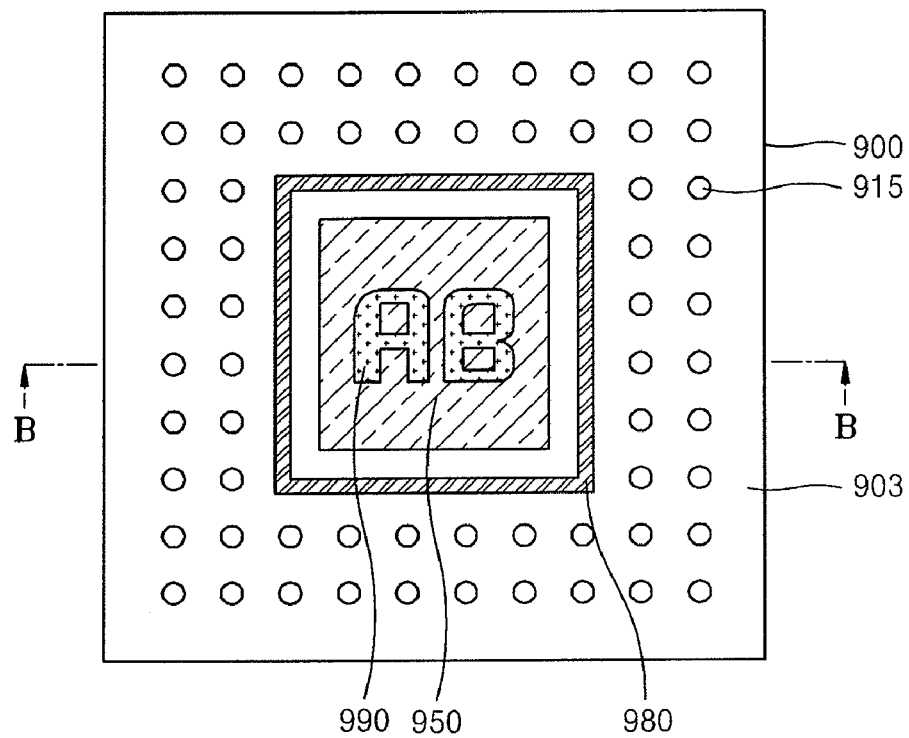
Figure 11B:
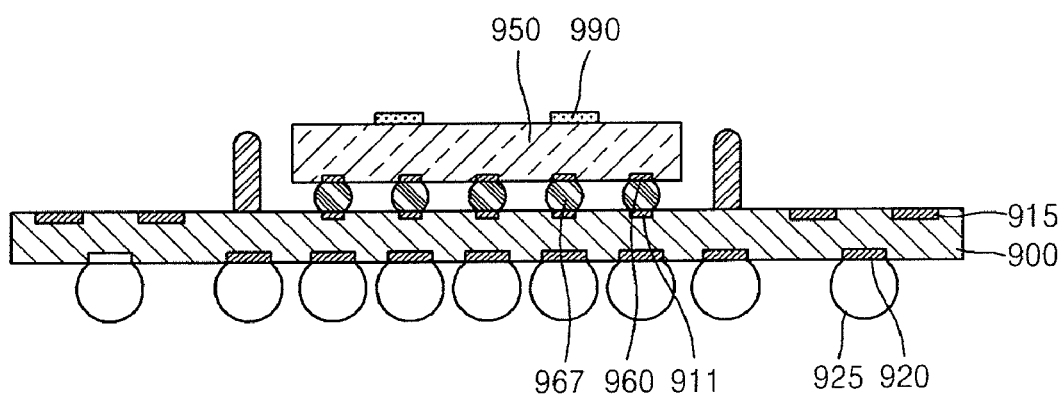

Referring to FIGS. 8, 11A, and 11B, a dam 980 may be formed on a first surface of the substrate 900 between the semiconductor chip 950 and the pad forming unit 903 of the substrate 900 by performing, for example, an inkjet process (S830). The dam 980 may be arranged in the same dam patterns as FIGS. 2A through 2H. In the process of forming the dam 980 using an inkjet process (S830), letters 990 that indicate the kind of package and characteristics may be marked on the semiconductor chip 950. A process for hardening the letters 990 and the dam 980 may further be performed after the marking process and the dam forming process. The hardening process may be performed using, for example, ultraviolet rays, or a thermal hardening process.

The marking may be performed after the dam 980 is formed, or the dam 980 may be formed after the marking is finished. The process of forming the dam 980 and the process of marking the letters 990 may be simultaneously performed. The dam 980 may be formed of the same material used to form the letters 990.

Figure 12A:
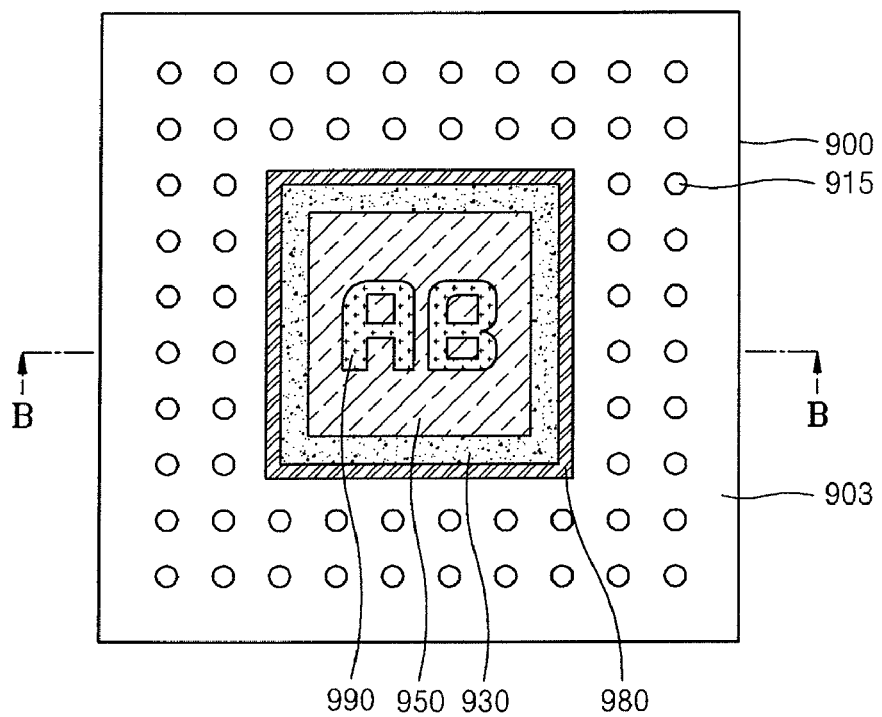
Figure 12B:
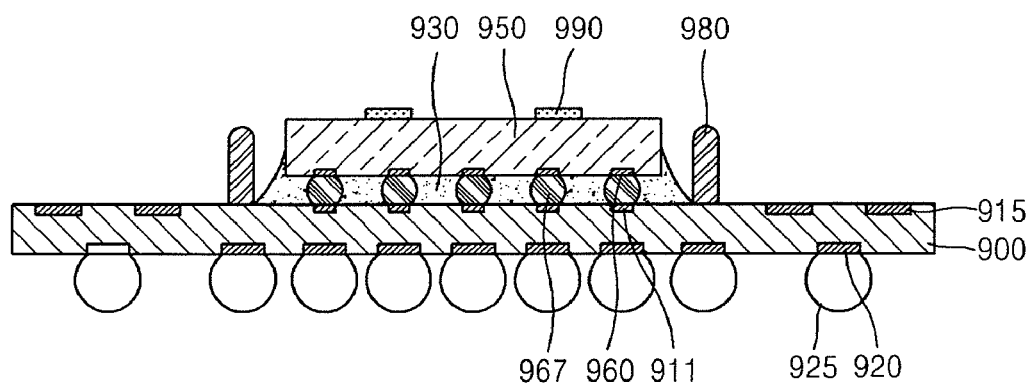

Referring to FIGS. 8, 12A, and 12B, an underfill material 930 may be deposited between an active surface of the semiconductor chip 950 and the first surface of the substrate 900 (S840). The underfill material 930 protects the solder balls 967 and the dam 980 prevents the underfill material 930 bleeding towards the pads 915.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a semiconductor package, the method comprising:
   manufacturing a substrate that comprises a chip mounting unit and a pad forming unit disposed on an outer region of the chip mounting unit and a plurality of pads disposed on the pad forming unit;
   mounting a semiconductor chip on the chip mounting unit of the substrate;
   forming a dam on at least a part of the substrate between the semiconductor chip and the pad forming unit, wherein the forming of the dam includes marking letters on a top surface of the semiconductor chip, and wherein the dam and the letters are formed of the same material, and wherein an upper surface of the dam is rounded due to surface tension by using an inkjet process; and
   filling an underfill material between the semiconductor chip and the substrate.

2. The method of claim 1, further comprising: hardening the dam after forming the dam by using the inkjet process.

3. The method of claim 1, wherein the dam surrounds the semiconductor chip.

4. The method of claim 3, wherein the dam has a wound shape.

5. The method of claim 1, wherein the dam surrounds the semiconductor chip as multi-walls.

6. The method of claim 1, wherein the dam comprises at least one of a bar pattern corresponding to a side of the semiconductor chip or a corrugate pattern corresponding to at least a portion of the pads.

7. The method of claim 1, wherein the dam comprises ring shape patterns that surround at least portions of the pads, respectively.

8. The method of claim 1, wherein a distance between the semiconductor chip and the dam is 20 to 50 μm, a distance between the dam and the pads is 10 to 50 μm, and a distance between the semiconductor chip and the pads is 80 μm.

9. The method of claim 1, wherein the substrate comprises windows arranged on the chip mounting unit,
   wherein pads of the semiconductor chip are exposed through the windows,
   wherein the dam is disposed on a lower surface of the substrate of circumferences of the windows, and
   wherein the underfill material is formed to fill in the windows and the dam.

10. The method of claim 1, wherein the mounting of the semiconductor chip comprises: mounting two semiconductor chips.

11. The method of claim 10, wherein the two semiconductor chips are mounted in a stack type structure in which a lower semiconductor chip is mounted on the substrate through wire bonding, and an upper semiconductor chip is stacked on the lower semiconductor chip through flip chip bonding,
   wherein the underfill material is disposed between the upper semiconductor chip and the lower semiconductor chip, and
   wherein the dam is formed on the lower semiconductor chip to surround a portion of the lower semiconductor where the underfill material is disposed.

12. The method of claim 10, wherein the two semiconductor chips are mounted in a stack type structure in which a lower semiconductor chip is mounted on the substrate through flip chip bonding, and an upper semiconductor chip is stacked on the lower semiconductor chip through wire bonding,
   wherein the underfill material is disposed between the lower semiconductor chip and the substrate, and
   wherein the dam is formed on the substrate to surround a portion of the substrate where the underfill material is disposed.

13. The method of claim 10, wherein the two semiconductor chips are mounted on the substrate in which one of the two semiconductor chips is mounted on the substrate through flip chip bonding,
   wherein the underfill material is disposed between the semiconductor chip mounted on the substrate through flip chip bonding and the substrate, and
   wherein the dam is formed between the two semiconductor chips.

14. The method of claim 1, wherein the dam comprises an ink composite that comprises a (meta) acryl group monomer, a (meta) acryl group oligomer, a photo-initiator, a dye, and an additive.

* * * * *